(12) United States Patent
Huang et al.

(10) Patent No.: US 12,501,577 B2
(45) Date of Patent: Dec. 16, 2025

(54) AIR GUIDE MODULE

(71) Applicant: Qisda Corporation, Taoyuan (TW)

(72) Inventors: Cheng-Chih Huang, Taoyuan (TW); Kuan-Ting Lu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 142 days.

(21) Appl. No.: 18/507,093

(22) Filed: Nov. 13, 2023

(65) Prior Publication Data

US 2024/0188250 A1    Jun. 6, 2024

(30) Foreign Application Priority Data

Dec. 2, 2022    (CN) .......................... 202211539837.4

(51) Int. Cl.
*H05K 7/20*    (2006.01)

(52) U.S. Cl.
CPC ..... *H05K 7/20154* (2013.01); *H05K 7/20145* (2013.01)

(58) Field of Classification Search
CPC .............................. H05K 7/20145; F24F 1/028
See application file for complete search history.

(56) References Cited

U.S. PATENT DOCUMENTS

| | | | |
|---|---|---|---|
| 5,810,072 A * | 9/1998 | Rees ...................... | H01L 23/467 257/722 |
| 6,359,779 B1 * | 3/2002 | Frank, Jr. .................. | G06F 1/20 361/679.33 |
| 7,204,750 B2 * | 4/2007 | Shen ................... | H05K 7/20727 257/E23.099 |
| 10,986,751 B1 * | 4/2021 | Chen ................... | H05K 7/20172 |
| 11,326,621 B2 * | 5/2022 | Anderl ................... | F04D 29/563 |
| 11,985,791 B1 * | 5/2024 | Kom ................... | H05K 7/20836 |
| 2014/0226280 A1 * | 8/2014 | Alshinnawi ........ | H05K 7/20736 165/247 |
| 2017/0273214 A1 * | 9/2017 | Casparian ............... | G06F 1/203 |
| 2018/0242477 A1 * | 8/2018 | Gupta ................ | H05K 7/20145 |
| 2020/0080570 A1 * | 3/2020 | Anderl ............... | H05K 7/20009 |
| 2021/0315136 A1 * | 10/2021 | Chen ................... | H05K 7/20009 |
| 2021/0349508 A1 * | 11/2021 | Chang ................... | H05K 7/2039 |
| 2022/0386447 A1 * | 12/2022 | Kim ...................... | H05K 1/0203 |
| 2022/0418164 A1 * | 12/2022 | Shearman .......... | H05K 7/20563 |
| 2023/0103177 A1 * | 3/2023 | Ye ....................... | H05K 7/20727 361/695 |
| 2023/0148257 A1 * | 5/2023 | Chia ................... | H05K 7/20145 361/679.49 |
| 2023/0209779 A1 * | 6/2023 | Lancaster .......... | H05K 7/20736 454/184 |
| 2024/0206111 A1 * | 6/2024 | Sanada .............. | H05K 7/20145 |
| 2024/0276685 A1 * | 8/2024 | Placido Almeida ..... | H02B 1/56 |
| 2025/0142764 A1 * | 5/2025 | Chen ................... | H05K 7/20145 |

FOREIGN PATENT DOCUMENTS

CN            209749012        12/2019

* cited by examiner

*Primary Examiner* — Nelson J Nieves

(57) ABSTRACT

An air guide module includes a casing and a first flexible air guide structure. The casing includes a first fixing portion. The first flexible air guide structure includes a first flexible cover and a second fixing portion connected to the first flexible cover. The first flexible air guide structure is fixed to the first fixing portion of the casing through the second fixing portion. The first flexible cover and a part of the casing form a heat dissipation channel. The first flexible cover is deflected relative to the casing when an airflow passes through the heat dissipation channel.

11 Claims, 7 Drawing Sheets

AIR GUIDE MODULE

CROSS-REFERENCE TO RELATED APPLICATION

This application claims the priority benefit of Chinese application serial no. 202211539837.4, filed on Dec. 2, 2022. The entirety of the above-mentioned patent application is hereby incorporated by reference herein and made a part of this specification.

BACKGROUND

Technical Field

The disclosure relates to an air guide module. Particularly, the disclosure relates to an air guide module with better air guide performance.

Description of Related Art

With the advancement of science and technology, the performance of electronic devices is improved, and there are higher requirements for heat dissipation. A heat dissipation device is typically used with structures such as an air guide cover to improve heat dissipation performance. How an air guide module improves air guide performance is an aim of research in the related field.

SUMMARY

The disclosure provides an air guide module with better air guide performance.

According to an embodiment of the disclosure, an air guide module includes a casing and a first flexible air guide structure. The casing includes a first fixing portion. The first flexible air guide structure includes a first flexible cover and a second fixing portion connected to the first flexible cover. The first flexible air guide structure is fixed to the first fixing portion of the casing through the second fixing portion. The first flexible cover and a part of the casing form a heat dissipation channel. The first flexible cover is deflected relative to the casing when an airflow passes through the heat dissipation channel.

In an embodiment of the disclosure, the casing includes a slide rail. The first flexible air guide structure includes a slide groove disposed on the slide rail. The first flexible cover is deflected relative to the casing along an extension direction of the slide rail through the slide rail and the slide groove working together.

In an embodiment of the disclosure, the slide groove and the second fixing portion are located at the same side of the first flexible cover and are close to each other.

In an embodiment of the disclosure, the air guide module further includes a second flexible air guide structure. The second flexible air guide structure includes a second flexible cover. The second flexible cover includes a first air inlet and a first connection opening opposite to each other. The first connection opening is connected to the first flexible cover. A size of the first connection opening is different from a size of the first air inlet.

In an embodiment of the disclosure, the first flexible air guide structure includes a first fitting portion. The second flexible air guide structure includes a second fitting portion. The first fitting portion is detachably disposed at the second fitting portion, such that the first connection opening is connected to the first flexible cover.

In an embodiment of the disclosure, the air guide module further includes a third flexible air guide structure. The third flexible air guide structure includes a third flexible cover. The third flexible cover includes a second air inlet and a second connection opening opposite to each other. The second connection opening is detachably connected to the first flexible cover. A size of the second connection opening is different from a size of the second air inlet. The size of the second air inlet is different from the size of the first air inlet.

In an embodiment of the disclosure, the first flexible air guide structure and the second flexible air guide structure are one-piece.

According to an embodiment of the disclosure, an air guide module includes a casing, a first flexible air guide structure, and a second flexible air guide structure. The casing includes a first fixing portion. The first flexible air guide structure includes a first flexible cover and a second fixing portion connected to the first flexible cover. The first flexible air guide structure is fixed to the first fixing portion of the casing through the second fixing portion. The second flexible air guide structure includes a second flexible cover. The second flexible cover includes a first air inlet and a first connection opening opposite to each other. The first connection opening is connected to the first flexible cover. A size of the first connection opening is different from a size of the first air inlet. Each of the first flexible cover and the second flexible cover is U-shaped and placed upside down on the casing, such that the first flexible cover, the second flexible cover, and a part of the casing form a heat dissipation channel. The first flexible cover and the second flexible cover are deflected relative to the casing when an airflow passes through the heat dissipation channel.

In an embodiment of the disclosure, the casing includes a slide rail. The first flexible air guide structure includes a slide groove disposed on the slide rail. The first flexible cover and the second flexible cover are deflected relative to the casing along an extension direction of the slide rail through the slide rail and the slide groove working together.

In an embodiment of the disclosure, the slide groove and the second fixing portion are located at the same side of the first flexible cover and are close to each other.

In an embodiment of the disclosure, the first flexible air guide structure includes a first fitting portion. The second flexible air guide structure includes a second fitting portion. The first fitting portion is detachably disposed at the second fitting portion, such that the first connection opening is connected to the first flexible cover.

Based on the foregoing, in the embodiments of the disclosure, the first flexible air guide structure of the air guide module has a flexible material. When the airflow passes through the heat dissipation channel formed by the first flexible cover, the first flexible cover may be deflected relative to the casing, and may obtain a relatively large flow in the flow field to have better air guide.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
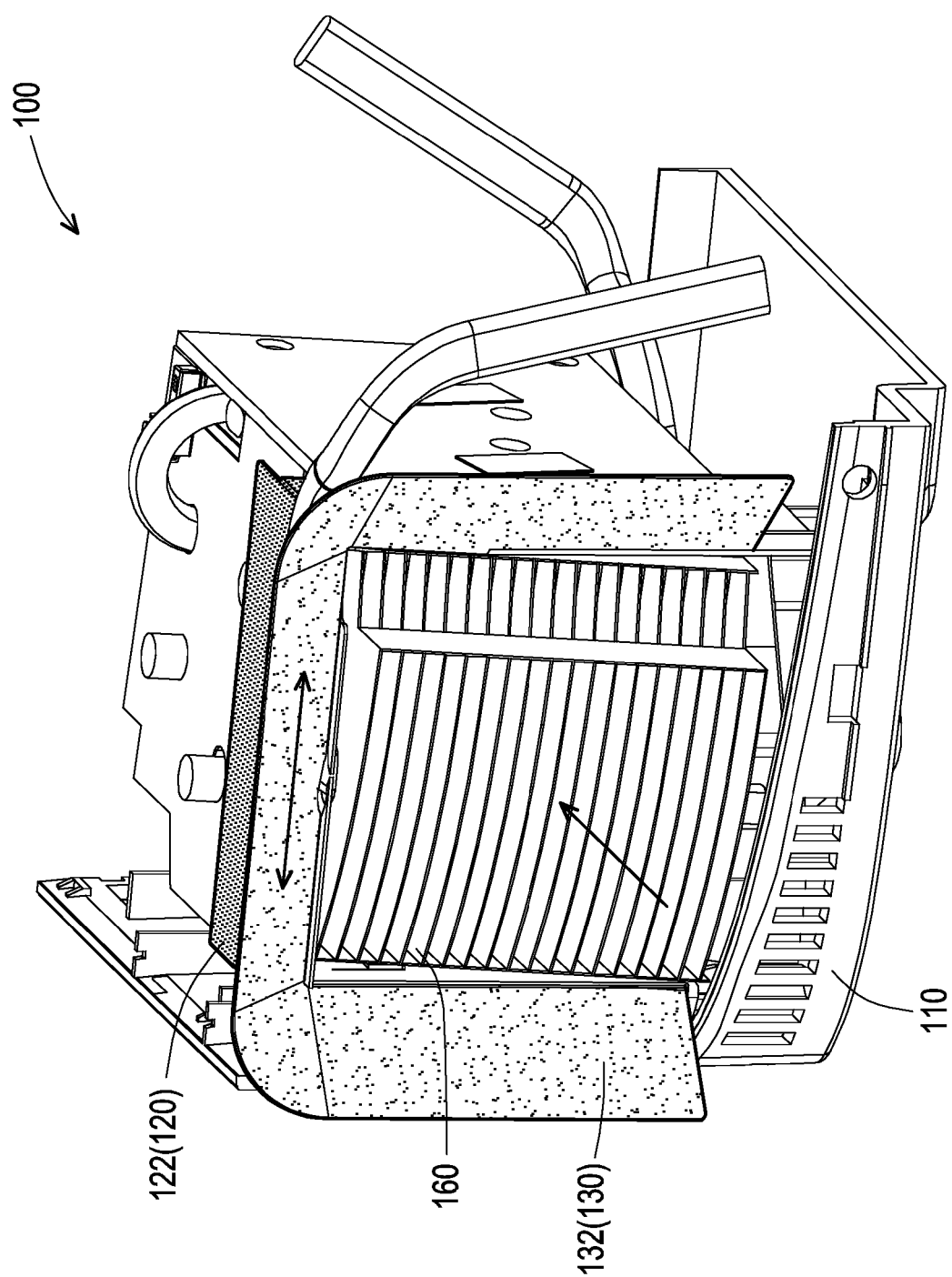
FIG. 1 to FIG. 3 are schematic views of an air guide module and a heat dissipation fin from different perspectives according to an embodiment of the disclosure.
Figure 2:
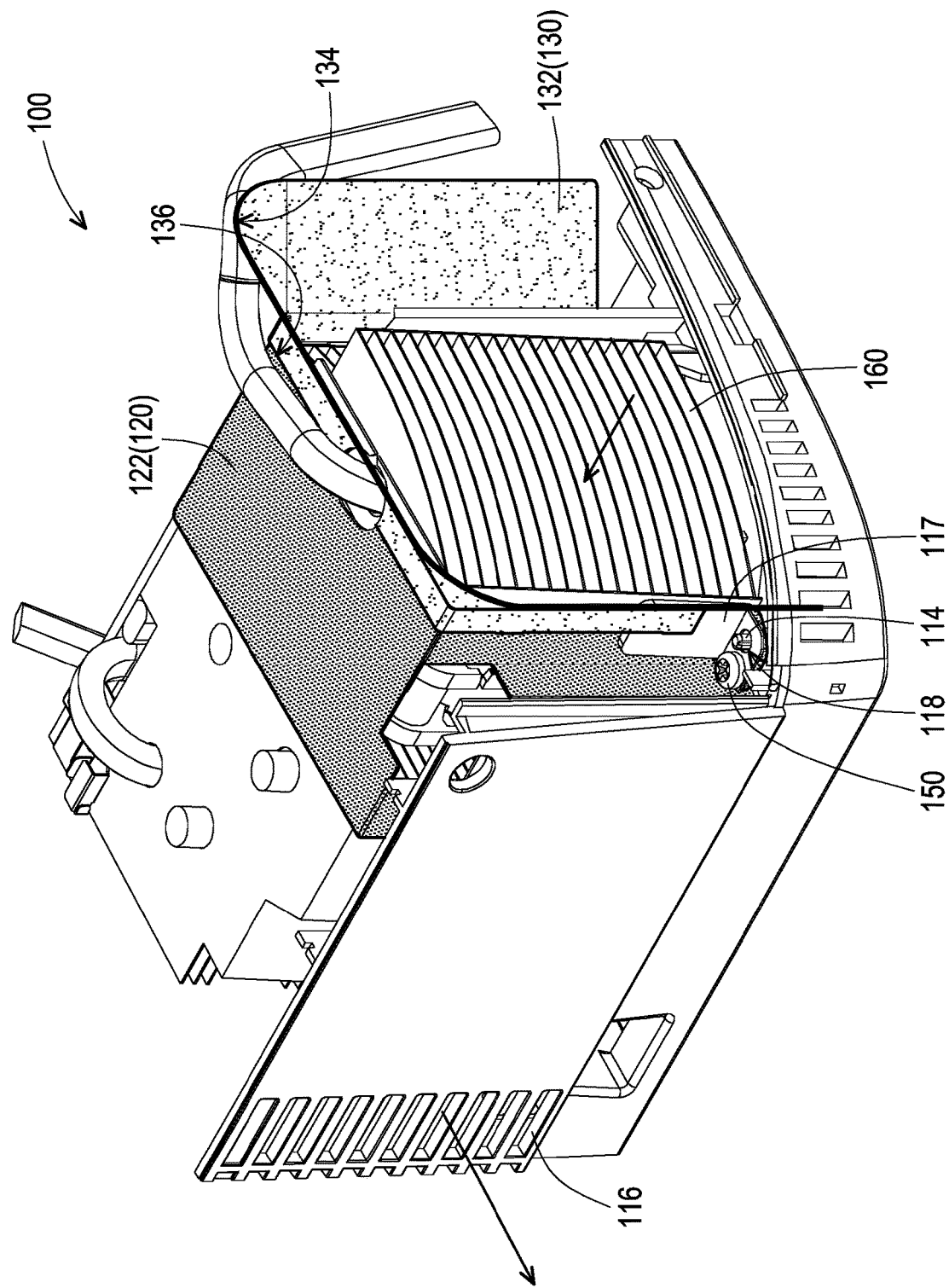
Figure 3:
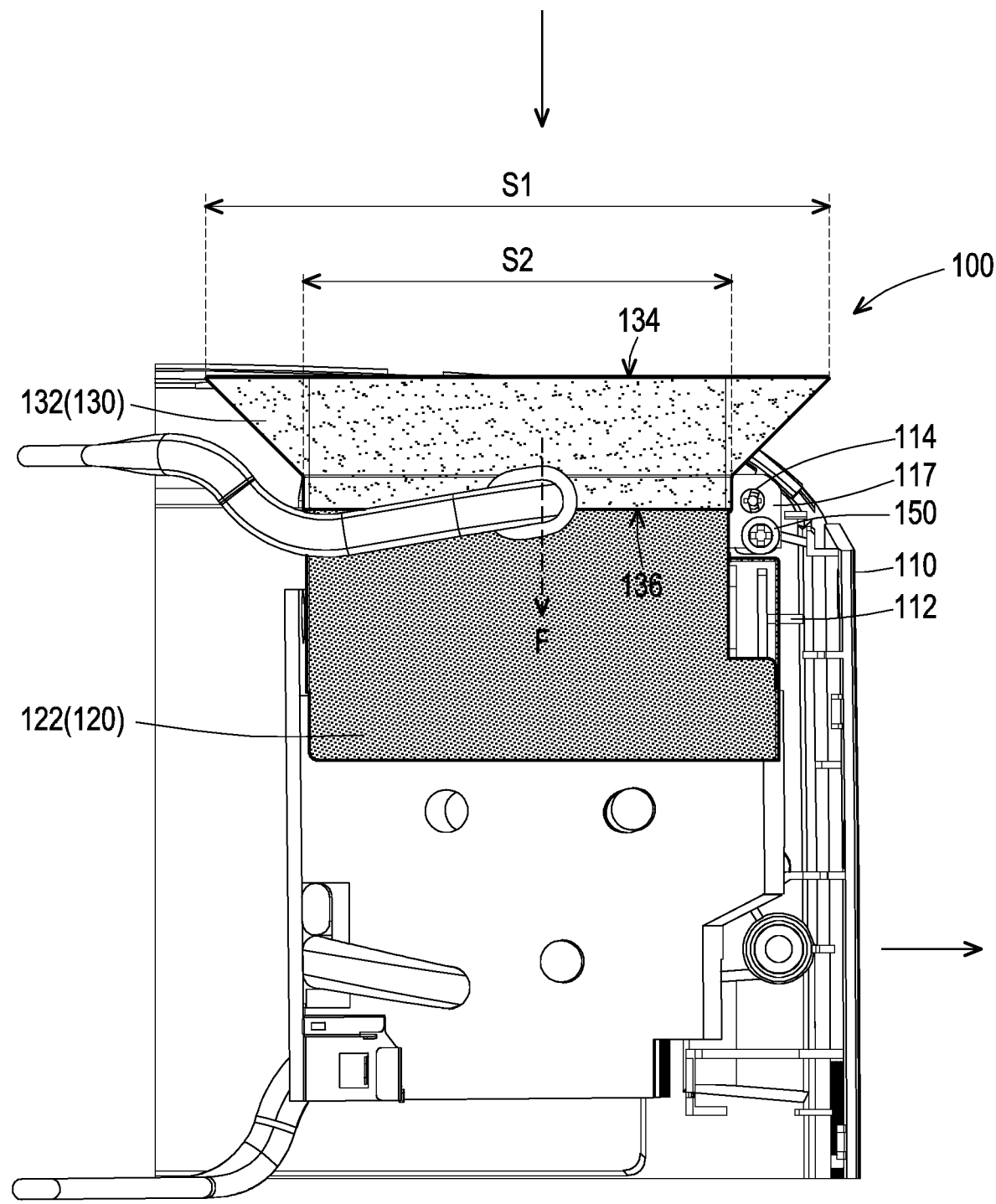
Figure 4:
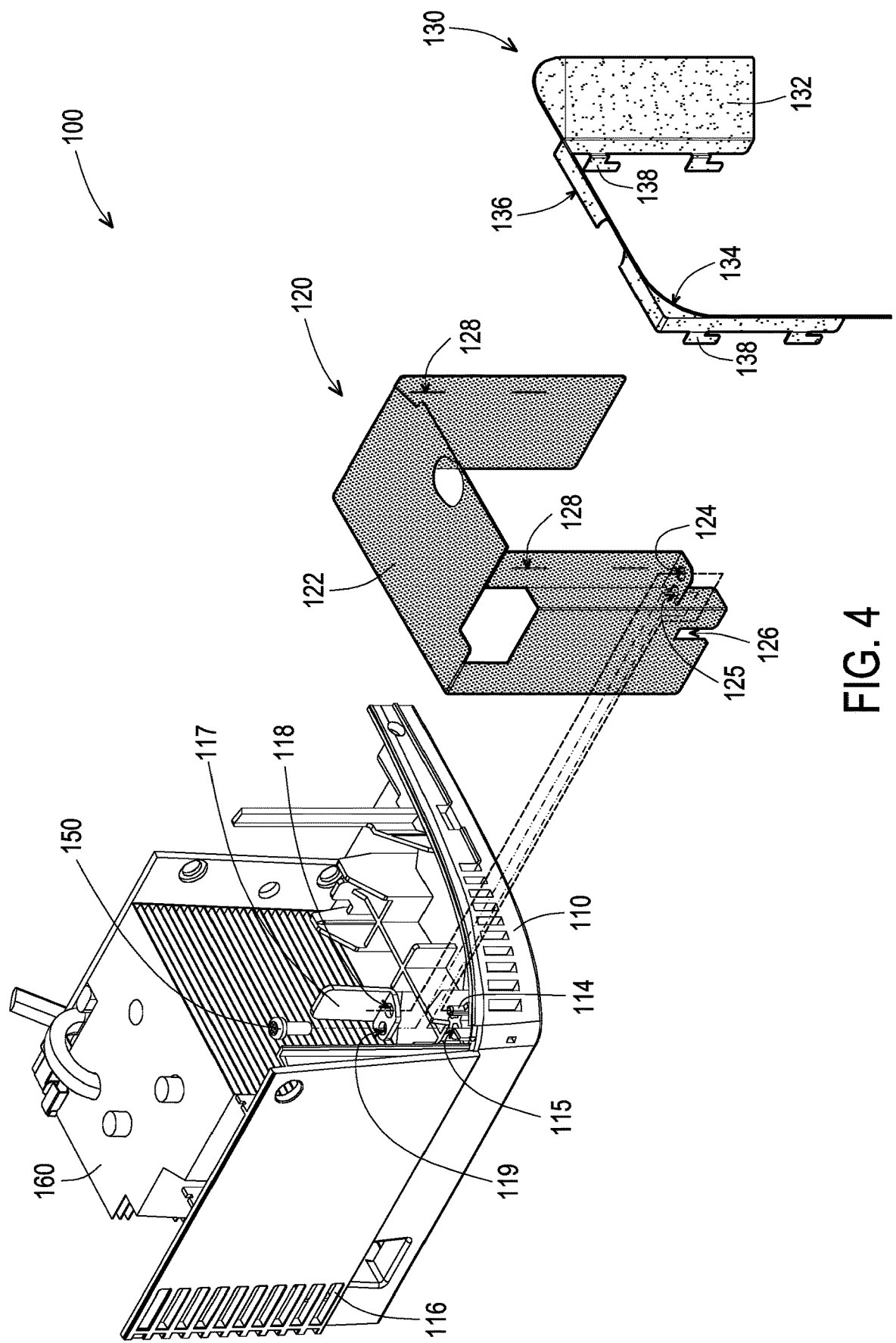
FIG. 4 is a schematic exploded view of FIG. 2.
Figure 5:
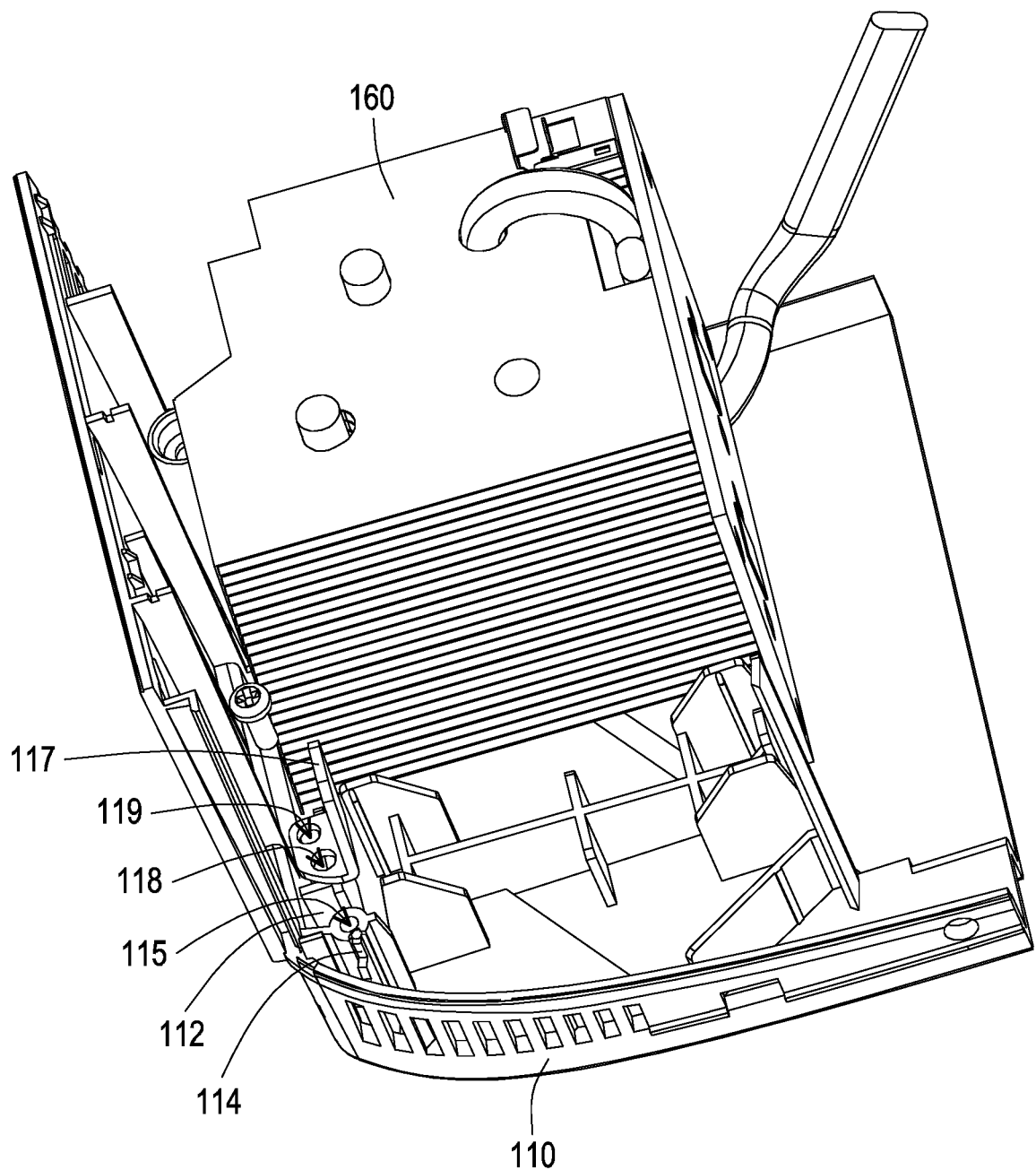
FIG. 5 is a schematic view of a casing and the heat dissipation fin of FIG. 1 from another perspective.

FIG. 1 to FIG. 3 are schematic views of an air guide module and a heat dissipation fin from different perspectives according to an embodiment of the disclosure. FIG. 4 is a schematic exploded view of FIG. 2. FIG. 5 is a schematic view of a casing and the heat dissipation fin of FIG. 1 from another perspective.

With reference to FIG. 1 to FIG. 5, an air guide module 100 of this embodiment is for example applied in a miniature projector. High heat may be may generated and concentrated during operation of the miniature projector. In this embodiment, a relatively large air volume may be introduced by the air guide module 100 to have better heat dissipation. Nonetheless, applications of the air guide module 100 of this embodiment is not limited thereto.

In this embodiment, the air guide module 100 includes a casing 110, a first flexible air guide structure 120, and a second flexible air guide structure 130. A heat dissipation fin 160 may be optionally disposed in the space between the casing 110, the first flexible air guide structure 120, and the second flexible air guide structure 130, such that the airflow passes through the heat dissipation fin 160 and dissipates heat from the heat dissipation fin 160 during the process where the airflow passes through the air guide module 100.

In this embodiment, when the airflow enters the air guide module 100 from the second flexible air guide structure 130, the first flexible air guide structure 120 and the second flexible air guide structure 130 of the air guide module 100 may be deflected in the left-right direction along with the airflow direction, as shown by the left and right arrows in FIG. 1, so as to obtain relatively great air intake volume. The structure will be described below.

As shown in FIG. 4, in this embodiment, the casing 110 includes first fixing portions 114 and 115. For example, the first fixing portion 114 is a boss, and the first fixing portion 115 is a screw hole. In addition, in this embodiment, the casing 110 further includes a pressing member 117. The pressing member 117 includes two through holes 118 and 119 respectively corresponding to the two first fixing portions 114 and 115.

The first flexible air guide structure 120 includes a first flexible cover 122 and two second fixing portions 124 and 125 connected to the first flexible cover 122. For example, the two second fixing portions 124 and 125 are two holes. The first flexible air guide structure 120 is fixed to the first fixing portions 114 and 115 of the casing 110 through the second fixing portions 124 and 125.

Specifically, in this embodiment, the two second fixing portions 124 and 125 of the first flexible air guide structure 120 are located between the pressing member 117 and the two first fixing portions 114 and 115 of the casing 110. The first fixing portion 114 (boss) of the casing 110 may pass through the second fixing portion 124 of the first flexible air guide structure 120 and the through hole 118 of the pressing member 117.

The other first fixing portion 115 (screw hole) of the casing 110 may be aligned with the second fixing portion 125 (hole) of the first flexible air guide structure 120 and the through hole 119 of the pressing member 117. A locking member 150 may pass through the through hole 119 of the pressing member 117 and the second fixing portion 125 (hole) of the first flexible air guide structure 120, and may be locked to the first fixing portion 115 (screw hole) of the casing 110. Nonetheless, in other embodiments, the numbers of first fixing portions and second fixing portions may each be one, and are not so limited.

In addition, the casing 110 includes a slide rail 112 (FIG. 5), and the first flexible air guide structure 120 includes a slide groove 126 (FIG. 4) disposed on the slide rail 112. The first flexible cover 122 is deflected relative to the casing 110 along an extension direction of the slide rail 112 through the cooperation of the slide rail 112 and the slide groove 126 working together, to enable a linear motion (for example, in the left-right direction of FIG. 1) of the first flexible cover 122, and limit the degrees of freedom in other directions (for example, the direct air intake direction, namely the front-rear direction, of FIG. 1).

In this embodiment, the slide groove 126 and the second fixing portions 124 and 125 are located at the same side of the first flexible cover 122 and are close to each other, such that only a local part at a single side of the first flexible cover 122 is a fixed end, and the other pars are free ends.

Furthermore, the second flexible air guide structure 130 includes a second flexible cover 132. The second flexible cover 132 includes a first air inlet 134 and a first connection opening 136 opposite to each other. The first connection opening 136 is connected to the first flexible cover 122. As shown in FIG. 3, in this embodiment, a size S2 of the first connection opening 136 is different from a size S1 of the first air inlet 134. Specifically, the size S2 of the first connection opening 136 is smaller than the size S1 of the first air inlet 134. It can be seen from FIG. 3 that the portion of the second flexible cover 132 close to the first air inlet 134 presents a gradually expanding bell mouth to introduce the external airflow.

Moreover, as shown in FIG. 4, the first flexible air guide structure 120 includes a first fitting portion 128, and the second flexible air guide structure 130 includes a second fitting portion 138. For example, the first fitting portion 128 is an engaging slot, and the second fitting portion 138 is an engaging hook, but it is not limited thereto. The first fitting portion 128 is detachably disposed at the second fitting portion 138, such that the first connection opening 136 is connected to the first flexible cover 122.

In this embodiment, each of the first flexible cover 122 and the second flexible cover 132 is U-shaped and placed upside down on the casing 110, such that the first flexible cover 122, the second flexible cover 132, and a part of the casing 110 form a heat dissipation channel F (labeled in FIG. 3).

In this embodiment, the first flexible air guide structure 120 is fixed on the casing 110 through a local part at a single side (left side), the other parts at this side (left side) and the other sides (upper side and right side) of the first flexible air guide structure 120 may swing freely. In addition, since the second flexible cover 132 is engaged with the first flexible air guide structure 120 instead of being directly fixed to the casing 110, the second flexible air guide structure 130 may be linked with the first flexible air guide structure 120, such that the second flexible air guide structure 130 has a relatively large degree of freedom of deflection, and may swing along the direction from which the airflow enters.

With the above configuration, the first flexible cover 122 and the second flexible cover 132 are deflected relative to the casing 110 when the airflow passes through the heat dissipation channel F. The second flexible cover 132 may be deflected according to the maximum flow velocity in the external flow field to obtain the maximum flow. The first flexible cover 122 moves together with the driving of the second flexible cover 132, such that the airflow entering the second flexible cover 132 can pass through the heat dissipation channel F (FIG. 3) to the maximum extent, so as to have better air guide performance. Moreover, the airflow exits from an air outlet 116 (FIG. 2) of the casing 110 after passing through the heat dissipation fin 160.

It is worth mentioning that, in this embodiment, the size of the first air inlet 134 of the second flexible air guide structure 130 of the air guide module 100 may correspond to the size of the air inlet on the casing of the electronic device where the air guide module 100 is mounted. As a result, depending on different casing sizes of the electronic device where the air guide module 100 is mounted, the designer may select to dispose flexible air guide structures of other sizes at the first flexible air guide structure 120, such that the air guide module may be applied to a relatively large number of models.

Figure 6:
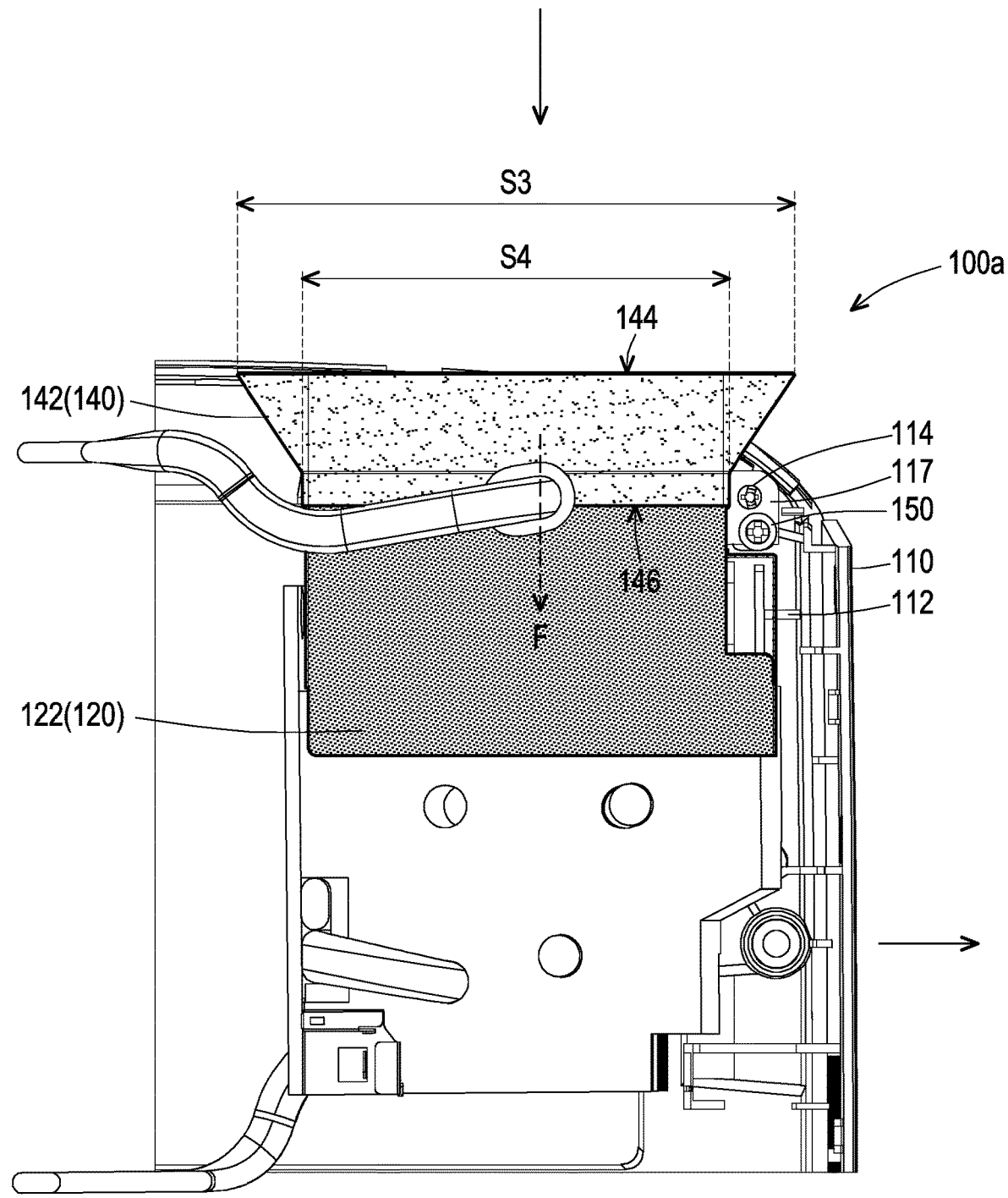
FIG. 6 is a schematic top view of an air guide module and a heat dissipation fin according to another embodiment of the disclosure.

FIG. 6 is a schematic top view of an air guide module and a heat dissipation fin according to another embodiment of the disclosure. With reference to FIG. 6, the main difference between the air guide module 100 of FIG. 3 and an air guide module 100a of FIG. 6 is that, in this embodiment, the air guide module 100a replaces the second flexible air guide structure 130 of FIG. 3 with a third flexible air guide structure 140.

The third flexible air guide structure 140 includes a third flexible cover 142, and the third flexible cover 142 includes a second air inlet 144 and a second connection opening 146 opposite to each other. The second connection opening 146 is detachably connected to the first flexible cover 122. Similarly, a size S4 of the second connection opening 146 is different from a size S3 of the second air inlet 144. Specifically, the size S4 of the second connection opening 146 is smaller than the size S3 of the second air inlet 144. It can be seen from FIG. 6 that the portion of the third flexible cover 142 close to the second air inlet 144 presents a gradually expanding bell mouth to introduce the external airflow.

By comparing FIG. 3 and FIG. 6, it can be seen that the size S4 of the second connection opening 146 of the third flexible cover 142 is the same as the size S2 of the first connection opening 136 of the second flexible cover 132, and the size S3 of the second air inlet 144 (FIG. 6) of the third flexible cover 142 is different from the size S1 (FIG. 3) of the first air inlet 134 of the second flexible cover 132. As such, the air guide module 100a of FIG. 6 is applicable to a model with a relatively small size of the air inlet on the casing.

Nonetheless, in other embodiments, the designer may also select to dispose a flexible air guide structure with a relatively large air inlet at the first flexible air guide structure 120, so as to adapt to a case with a relatively large size of air inlet.

Figure 7:
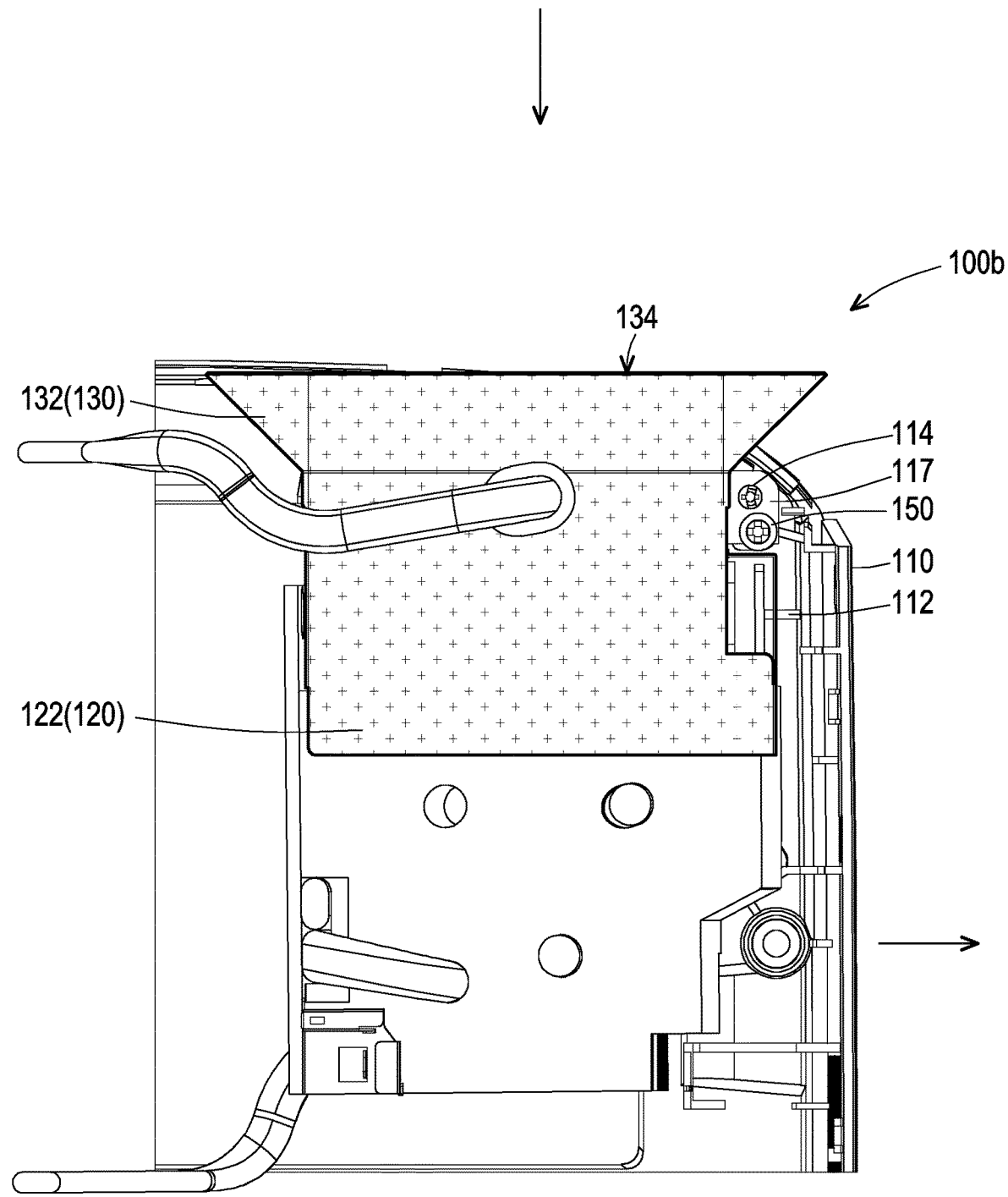
FIG. 7 is a schematic top view of an air guide module and a heat dissipation fin according to another embodiment of the disclosure.

FIG. 7 is a schematic top view of an air guide module and a heat dissipation fin according to another embodiment of the disclosure. With reference to FIG. 7, the main difference between the air guide module 100 of FIG. 3 and an air guide module 100b of FIG. 7 is that, in this embodiment, the first flexible air guide structure 120 and the second flexible air guide structure 130 are one-piece. In other words, in this embodiment, the first flexible air guide structure 120 and the second flexible air guide structure 130 are not detachable. Such a design may facilitate the mounting.

It should be noted that the second flexible air guide structure 130 may be optionally omitted in other embodiments. In other words, in other embodiments, the air guide module 100 may include the casing 110 and the first flexible air guide structure 120 only, and is not limited to the drawings.

In summary of the foregoing, in the embodiments of the disclosure, the first flexible air guide structure of the air guide module is fixed to the first fixing portion of the casing through the second fixing portion at a single side, an has a relatively great degree of freedom. Moreover, since the first flexible air guide structure has a flexible material, when the airflow passes through the heat dissipation channel formed by the first flexible cover, the first flexible cover may be deflected relative to the casing, and obtain a relatively large flow in the flow field to have better air guide.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An air guide module comprising:
   a casing comprising a first fixing portion; and
   a first air guide structure comprising a first cover and a second fixing portion connected to the first cover, wherein the first air guide structure is fixed to the first fixing portion of the casing through the second fixing portion, the first cover and a part of the casing form a heat dissipation channel, and the first cover is deflected relative to the casing when an airflow passes through the heat dissipation channel,
   wherein the casing comprises a slide rail, the first air guide structure comprises a slide groove disposed on the slide rail, and the first cover is deflected relative to the casing along an extension direction of the slide rail through the slide groove slidably disposed on the slide rail.

2. The air guide module according to claim 1, wherein the slide groove and the second fixing portion are located at the same side of the first cover.

3. The air guide module according to claim 1, further comprising:
   a second air guide structure comprising a second cover, wherein the second cover comprises a first air inlet and a first connection opening opposite to each other, the first connection opening is connected to the first cover, and a size of the first connection opening is different from a size of the first air inlet.

4. The air guide module according to claim 3, wherein the first air guide structure comprises a first fitting portion, the second air guide structure comprises a second fitting portion, and the first fitting portion is detachably disposed at the second fitting portion, such that the first connection opening is connected to the first cover.

5. The air guide module according to claim 4, further comprising:
   a third air guide structure comprising a third cover, wherein the third cover comprises a second air inlet and a second connection opening opposite to each other, the second connection opening is detachably connected to the first cover, a size of the second connection opening is different from a size of the second air inlet, and the size of the second air inlet is different from the size of the first air inlet.

6. The air guide module according to claim 3, wherein the first air guide structure and the second air guide structure are one-piece.

7. An air guide module comprising:
a casing comprising a first fixing portion;
a first air guide structure comprising a first cover and a second fixing portion connected to the first cover, wherein the first air guide structure is fixed to the first fixing portion of the casing through the second fixing portion; and
a second air guide structure comprising a second cover, wherein the second cover comprises a first air inlet and a first connection opening opposite to each other, the first connection opening is connected to the first cover, and a size of the first connection opening is different from a size of the first air inlet, wherein
each of the first cover and the second cover is U-shaped and placed upside down on the casing, such that the first cover, the second cover, and a part of the casing form a heat dissipation channel, and the first cover and the second cover are deflected relative to the casing when an airflow passes through the heat dissipation channel.

8. The air guide module according to claim 7, wherein the casing comprises a slide rail, the first air guide structure comprises a slide groove disposed on the slide rail, and the first cover and the second cover are deflected relative to the casing along an extension direction of the slide rail through the slide groove slidably disposed on the slide rail.

9. The air guide module according to claim 8, wherein the slide groove and the second fixing portion are located at the same side of the first cover.

10. The air guide module according to claim 7, wherein the first air guide structure comprises a first fitting portion, the second air guide structure comprises a second fitting portion, and the first fitting portion is detachably disposed at the second fitting portion, such that the first connection opening is connected to the first cover.

11. The air guide module according to claim 7, wherein the first air guide structure and the second air guide structure are one-piece.

* * * * *